United States Patent [19]

Stites et al.

[11] 4,044,308
[45] Aug. 23, 1977

[54] COMMUNICATION TRANSMITTING APPARATUS WITH CARRIER LEVEL CONTROL

[75] Inventors: Francis H. Stites, Wayland; Colin B. Weir, Franklin, both of Mass.

[73] Assignee: GTE Sylvania Incorporated, Stamford, Conn.

[21] Appl. No.: 725,001

[22] Filed: Sept. 20, 1976

[51] Int. Cl.² .............................................. H04B 1/04
[52] U.S. Cl. .................................. 325/144; 325/159; 325/187; 332/38
[58] Field of Search ............... 325/144, 150, 159, 182, 325/187; 332/38

[56] References Cited

U.S. PATENT DOCUMENTS 3,662,290  5/1972  Elliott ...................................... 332/38

Primary Examiner—Robert L. Griffin
Assistant Examiner—Marc E. Bookbinder
Attorney, Agent, or Firm—David M. Keay; Norman J. O'Malley; Elmer J. Nealon

[57] ABSTRACT

Low level amplitude modulated radio transmitting apparatus employing a DC control loop from the output amplifier to the audio modulating stage for maintaining the carrier output level constant. The audio signal to be transmitted is superimposed on the DC control signal and the resulting signal is applied to an operational amplifier that controls a current driver supplying operating potential to the modulating stage. A DC limiter at the input to the operational amplifier limits the DC control signal to the operational amplifier thus preventing continuous overdriving of the RF elements in the event of a disruption in the DC control loop. An audio by-pass permits the audio signal to by-pass the DC limiter and be summed with the limited DC control signal at the input to the operational amplifier.

6 Claims, 2 Drawing Figures

COMMUNICATION TRANSMITTING APPARATUS WITH CARRIER LEVEL CONTROL

BACKGROUND OF THE INVENTION

This invention relates to communication equipment. More particularly, it is concerned with amplitude modulated radio transmitters having a control loop for regulating the carrier output power.

It is common practice for amplitude modulated radio transmitters to be designated to operate at a normal carrier output level that is of the order of one-fourth the power required during peaks of modulation. The maximum peak power available typically is in excess of four times the normal carrier level in order to allow for proper operation under adverse conditions. Since the extremely high levels of modulation are present for only very short periods of time, it is not economical or practical to design transmitters for continuous operation at high peak power levels.

In amplitude modulated radio transmitters employing low level modulation a DC control loop is frequently employed to maintain the carrier output constant. The output power from the final power amplifier of the transmitter is monitored by an RF coupler and detector arrangement, including a filter to remove any modulation which may be present, in order to produce a DC voltage proportional to the carrier output power. This DC voltage is compared with a reference voltage which may be variable in order to permit the carrier output level to be set. The resulting DC control voltage is applied to a low power RF amplifier stage to control its output and thereby maintain the carrier output at the desired level. The audio signal to be transmitted is combined with the DC control voltage and applied to the low power amplifier stage to amplitude modulate the carrier signal.

In transmitting apparatus of the foregoing type a failure or discontinuity in an element included in the carrier control loop may cause the DC control voltage to rise, thereby causing the transmitter to attempt to produce maximum carrier output power. Since the transmitter is not designed for continuous operation at the maximum level, other elements will be overdriven and one or more elements may be destroyed. That is, the control loop when disrupted by a relatively minor component failure may cause other components to be overdriven and burned out thereby causing complete failure and additional damage to the transmitter.

SUMMARY OF THE INVENTION

Communication transmitting apparatus in accordance with the present invention includes a carrier output level control loop which provides overload protection in the event of a disruption in the control loop. The apparatus includes an RF carrier signal source and an audio signal input means. A first amplifier means has an input connected to the RF carrier signal source, and a second amplifier has its input coupled to the output of the first amplifier means. A control signal means is coupled to the output of the second amplifier means and operates to produce a DC control signal which is related to the carrier signal voltage at the output of the second amplifier means.

The apparatus also includes a modulating and control means which is connected to the audio signal input means, to the control signal means, and to the first amplifier means. The RF carrier signal passing through the first amplifier means is amplitude modulated with the audio signal by the modulating and control means. The modulating and control means also adjusts the carrier signal voltage produced at the output of the first amplifier means in response to the DC control signal in a manner which tends to maintain the carrier signal voltage at the output of the second amplifier means constant.

The modulating and control means includes DC limiting means for preventing the DC control signal from causing the modulating and control means to increase the carrier signal voltage at the output of the first amplifier means above a predetermined voltage. It also includes an audio by-pass means for causing the audio signal to by-pass the DC limiting means whereby the DC limiting means has not effect on the audio signal. Thus, the continuous carrier output power from the second amplifier means is prevented from rising above a predetermined level despite disruptions occurring at any point in the control loop.

BRIEF DESCRIPTION OF THE DRAWINGS

Additional objects, features, and advantages of communication transmitting apparatus in accordance with the present invention will be apparent from the following detailed discussion together with the accompanying drawings wherein.

DETAILED DESCRIPTION OF THE INVENTION

Figure 1:
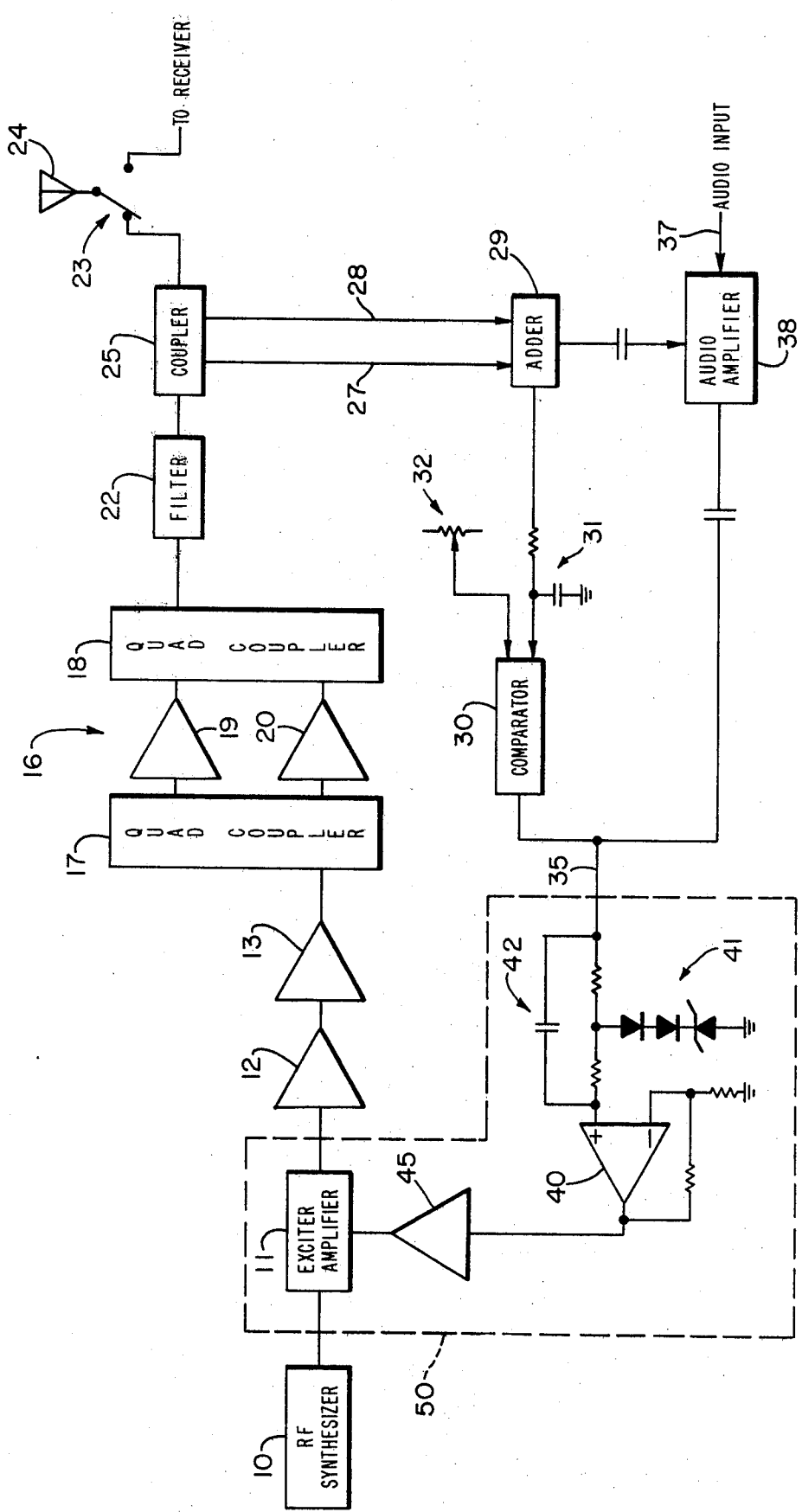
FIG. 1 is a schematic diagram of communication transmitting apparatus in accordance with the present invention.

FIG. 1 is a schematic diagram illustrating transmitting apparatus of communication equipment in accordance with the present invention. The apparatus includes an RF synthesizer 10 which is operable to produce any one of several RF carrier frequencies. The RF carrier signal from the RF synthesizer 10 is applied to an exciter amplifier 11 which, as will be explained in greater detail hereinbelow, is a multiple stage RF microcircuit amplifier. An intermediate amplifier stage of the exciter amplifier 11 is amplitude modulated by the audio information to be transmitted. In addition, the DC current applied to this intermediate stage is controlled by a control signal to regulate the carrier output level as will be explained in detail hereinbelow.

The modulated output of the exciter amplifier 11 is applied to an exciter output amplifier 12. The output of the exciter output amplifier 12 is applied to a driver amplifier 13. The output of the driver amplifier 13 is applied to an output power amplifier 16. The output amplifier 16 is a quadrature coupled amplifier employing two amplifier stages 19 and 20 coupled together in quadrature by two quadrature couplers 17 and 18. The output of the power amplifier 16 is applied to an antenna 24 by way of a filter 22, a coupler 25, and a transmit-receive switch 23.

The filter 22 removes the harmonics of the carrier frequency present in the output from the power amplifier 16. The outputs of the coupler 25 on lines 27 and 28 are a detected portion of the forward power passing to the antenna and a detected portion of the reverse power reflected from the antenna. The detected signals on lines 27 and 28 each consist of a DC voltage which is a measure of the forward or reverse carrier output power and a superimposed audio voltage. The detected forward and reverse voltages are combined by an adder 29 and the result is applied to a comparator 30 by way of an audio filter, indicated symbolically at 31, which removes the audio signal. Thus, A DC voltage which is proportional to the output level of the carrier signal at the output of the power amplifier 16 is one of the inputs to the comparator 30. As indicated symbolically at 32, the other input to the comparator 30 is an adjustable DC voltage which, as will be apparent, is the control for regulating the carrier output level from the power amplifier 16. The output of the comparator 30 on line 35 is a DC control voltage which is proportional to the difference between the two input voltages.

The audio information to be transmitted is applied as the audio input on input line 37 to an audio amplifier 38. Audio feedback from the output amplifier 16 is also coupled to the audio amplifier 38 by way of the coupler 25 and adder 29. The audio voltage from the amplifier 38 is coupled to line 35. Thus, the signal on line 35 is a combination of the DC control signal from the comparator 30 and the audio signal from the audio amplifier 38.

Line 35 is coupled to the non-inverting input of an operational amplifier 40 by way of an arrangement which includes a DC limiter 41 and an audio by-pass section 42. The DC limiter 41 limits the DC control voltage which can be applied to the operational amplifier 40 and the audio by-pass section 42 permits the audio signal to by-pass the DC limiter. The operation of these elements will be discussed in greater detail hereinbelow.

The output of the operational amplifier 40 controls current flow through a current driver 45 which supplies operating current to the intermediate stage of the exciter amplifier 11. The output level of the carrier signal from the exciter amplifier 11 is thereby determined and the carrier signal is amplitude modulated. The resulting output from the exciter amplifier 11 is then amplified by the exciter output amplifier 12, the driver amplifier 13, and the power amplifier 16, in order, before being filtered and applied to the antenna 24.

Figure 2:
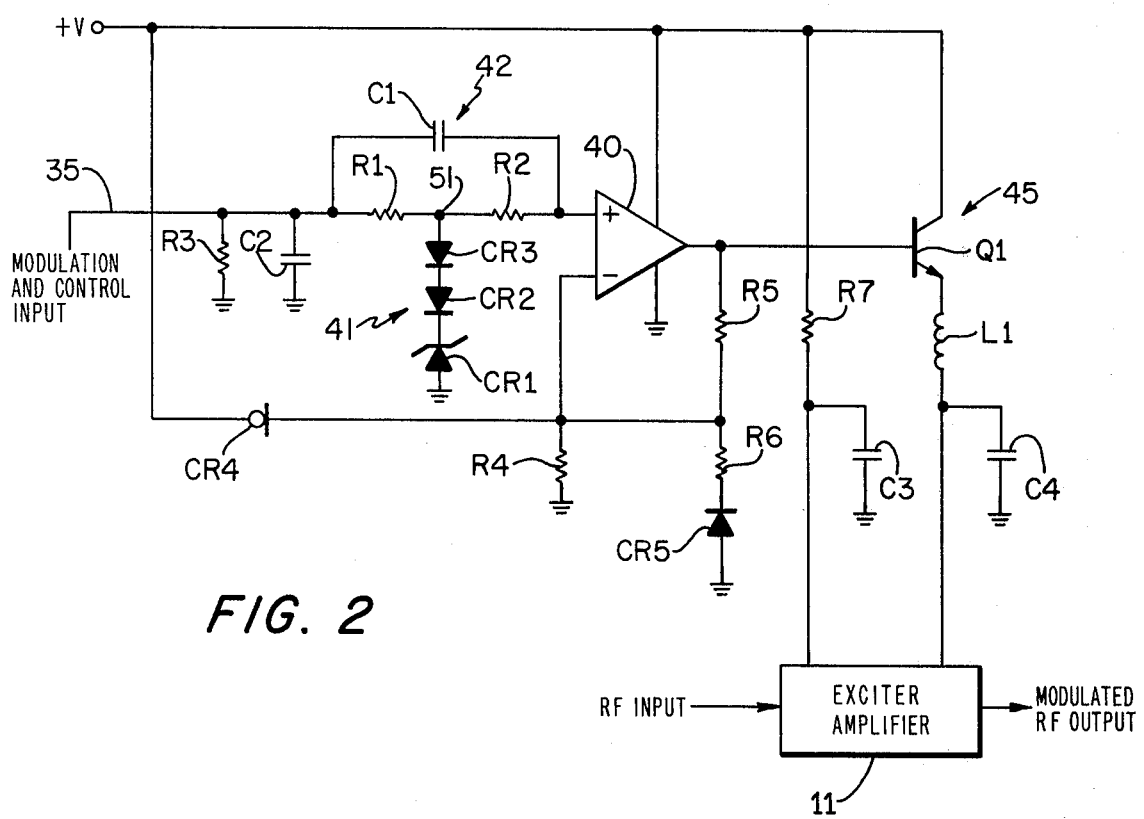
FIG. 2 is a detailed schematic diagram of a portion of the apparatus of FIG. 1.

A detailed schematic diagram of a specific embodiment of the portion of the apparatus illustrated within the dashed lines 50 of FIG. 1 is shown in FIG. 2. Other portions of the apparatus illustrated in FIG. 1 employ conventional elements of straightforward design and, therefore, are not described in detail herein. As shown in FIG. 2 the input line 35 is connected to the non-inverting input of the operational amplifier 40 by way of the DC limiter 41 and audio by-pass 42. The DC limiter includes two resistances R1 and R2 connected in series between the line 35 and the non-inverting input of the amplifier. Diodes CR1, CR2, and CR3 are connected in series between the juncture 51 of the two resistances and ground as illustrated in FIG. 2. One of the diodes, CR1, is a voltage reference diode and the other two diodes, CR2 and CR3, provide temperature compensation such that the breakdown voltage of the three diodes in series remains constant. A capacitance C1 is connected in shunt across resistances R1 and R2 to provide the audio by-pass 42 around the DC limiter.

Various other components for proper operation of the operational amplifier 40 are connected as shown in FIG. 2. The output of amplifier 40 is connected to the base of an NPN transistor Q1 which is the current driver 45. The collector of transistor Q1 is connected to the positive voltage supply +V and its emitter is connected through an inductance L1 to the exciter amplifier 11. The connection to the exciter amplifier 11 is to the collector of the intermediate stage. The operating voltage is supplied to other portions of the exciter amplifier 11 by way of a resistance R7.

As explained hereinabove the input signal on line 35 to the portion of the apparatus illustrated in FIG. 2 has a DC voltage component which is a measure of the difference between the carrier output level and the desired carrier output level and an audio voltage component which contains the audio information to be transmitted. The resistance R1 and diodes CR1, CR2, and CR3 of the DC limiter prevent the voltage at the juncture 51 due to the DC component from rising above a predetermined value. Since the input impedance of the operational amplifier 40 is high, essentially the same DC voltage is present at its non-inverting input. All of the audio voltage component, however, effectively by-passes the DC limiter by means of capacitance C1 and is summed with the limited DC component at the input of the amplifier 40.

The other components permit operation of the amplifier 40 and current driver transistor Q1 in a conventional manner. The gain of the amplifier 40 is set by resistances R5 and R4 at low modulation levels. At high modulation levels diode CR5 breaks down and resistance R6 acts in parallel with resistance R4 thereby increasing the gain to compensate for the compression inherent in the microcircuit. Diode CR4 is a constant current diode which makes the voltage at the inverting input of amplifier 40 independently of changes in the supply voltage. Resistance R7 regulates the operating voltage supplied to the exciter amplifier 11, and the combination of inductance L1 and capacitance C4 eliminates oscillations in the control loop by reducing the gain above certain frequencies, specifically about 5MHz.

A specific embodiment of the portion of the apparatus shown in FIG. 2 was fabricated employing the components listed below.

| | |
|---|---|
| Operational Amplifier 40 | HA2-2602-2 |
| Microcircuit Exciter Amplifier 11 | CA870 (TRW) |
| NPN Transistor Q1 | 2N4237 |
| Diode CR1 | 1N753A |
| Diode CR2 | 1N4531 |
| Diode CR3 | 1N4531 |
| Diode CR4 | 1N5291 |
| Diode CR5 | 1N752A |
| R1 | 3.6KΩ |
| R2 | 10KΩ |
| R3 | 510Ω |
| R4 | 7.5KΩ |
| R5 | 16KΩ |
| R6 | 3.9KΩ |
| R7 | 72Ω |
| C1 | 0.1μF |
| C2 | 0.1μF |
| C3 | 10μF |
| C4 | 100PF |
| L1 | 10μHY |
| +V | +27 volts |

The above disclosed specific embodiment of the circuitry shown in FIG. 2 was employed in conjunction with the other elements of communication transmitting equipment shown in FIG. 1. The other elements were of straightforward conventional design to provide an amplitude modulated transmitter for operating in the range of from 225 to 400 MHz. The transmitter was designed to produce a normal carrier output level of approximately 10 watts with a maximum of 40 watts at peak modulation. The maximum outputs of the exciter amplifier 11, exciter output amplifier 12, and driver amplifier 13 were 500 milliwatts, 4 watts, and 15 watts, respectively.

Under normal operation with the reference voltage setting 32 to the comparator 30 properly adjusted, any variables tending to change the carrier output level are reflected in the DC control voltage produced by the control loop and the current through transistor Q1 is adjusted so as to maintain the carrier output level constant. If there is a failure in any one of the elements from the exciter amplifier 11 through the coupler 25 with consequent reduction the detected carrier output level, the DC control voltage at line 35 increases to a maximum of 12 volts. If this voltage were applied to the operational amplifier 40, the result would be to drive the output amplifier 16 to produce the maximum output of more than 40 watts. Since the elements are not designed for continuous operation at this level, one or more components would be burned out. More specifically, if the driver amplifier 13 should fail, the exciter output amplifier 12 would be burned out. If one of the amplifier stages 19 or 20 should fail, the remaining stage would be driven to produce four times its normal output, since one-half of its output would be consumed by the termination resistance within the amplifier. In this case the remaining stage of the output amplifier might fail causing the driver amplifier and the exciter output amplifier to fail in turn.

In the specific embodiment as described, however, the DC voltage component at the input of the operational amplifier 40 is limited to 7.6 volts by the DC limiter. This control voltage causes the carrier output of the output amplifier 16 to be increased to about 15 watts. The elements are designed to withstand this level of operation and thus the damage to the apparatus is limited to the original failure. In addition, certain types of failure, for example in only one of the output amplifier stages 19 or 20 or in elements of the control loop other than the RF sections, would not be catastrophic but would permit continued although degraded operation of the apparatus.

While there has been shown and described what is considered a preferred embodiment of the present invention, it will be obvious to those skilled in the art that various changes and modifications may be made therein without departing from the invention as defined by the appended claims.

What is claimed is:

1. Communication transmitting apparatus including in combination
   a source of an RF carrier signal;
   audio signal input means for conducting an audio signal;
   first amplifier means having an input connected to said source of an RF carrier signal;
   second amplifier means having an input coupled to the output of the first amplifier means;
   control signal means coupled to the output of the second amplifier means and operable to produce a DC control signal related to the carrier signal voltage at the output of the second amplifier means; and
   modulating and control means connected to the audio signal input means, the control signal means, and the first amplifier means for amplitude modulating the RF carrier signal produced at the output of the first amplifier means with the audio signal and for adjusting the carrier signal voltage produced at the output of the first amplifier means in response to the DC control signal and in a manner tending to maintain the carrier signal voltage at the output of the second amplifier means constant;
   said modulating and control means including
      DC limiting means for preventing the control signal from causing the modulating and control means to increase the carrier signal voltage at the output of the first amplifier means above a predetermined voltage, and
      audio by-pass means for causing the audio signal to by-pass said DC limiting means whereby said DC limiting means has no effect on the audio signal.

2. Communication transmitting apparatus in accordance with claim 1 wherein
   said modulating and control means includes
      an input connection connected to said audio signal input means and to said control signal means for receiving the audio signal and the DC control signal,
      an output connection coupled to said first amplifier means, and
      means providing a conductive path between said input connection of said output connection for conducting the audio signal and the DC control signal therebetween;
   said DC limiting means includes circuit means connected between said conductive path and a point of reference potential and operable to prevent the DC control signal from producing a DC voltage at the output connection greater than a predetermined voltage; and
   said audio by-pass means includes circuit means coupled to said conductive path in shunt across said DC limiting means and operable to provide a high impedance to the DC control signal and a low impedance to the audio signal.

3. Communication transmitting apparatus in accordance with claim 1 wherein
   said modulating and control means includes
      an input connection connected to said audio signal input means and to said control signal means for receiving the audio signal and the DC control signal, and
      third amplifier means having its output coupled to said first amplifier means and having its input coupled to said input connection;
   said DC limiting means includes circuit means connected to said input connection, the input to said third amplifier means, and a point of reference potential; said DC limiting means being operable to prevent the DC voltage produced at the input of the third amplifier means by the DC control signal from exceeding a predetermined voltage;
   said audio by-pass means includes circuit means connected to said input connection and to the input of the third amplifier means and operable to provide a high impedance to the DC control signal and a low impedance to the audio signal.

4. Communication transmitting apparatus in accordance with claim 3 wherein said control signal means includes
   detection means coupled to the output of the second amplifier means for producing a DC voltage proportional to the voltage of the carrier signal at the output of the second amplifier means; and
   comparator means having a first input connected to said detection means and a second input connected to a point of reference potential; said comparator means being operable to produce a DC control signal having a voltage proportional to the difference between the voltage produced by the detection means and the reference potential.

5. Communication transmitting apparatus in accordance with claim 4 wherein
said DC limiting means includes
first and second resistance means connected in series between said input connection and the input of the third amplifier means, and
voltage reference diode means connected betweem the juncture of said first and second resistance means and said point of reference potential; said voltage reference diode means being operable to prevent the voltage at said juncture from exceeding a predetermined voltage;
said audio by-pass means includes capacitance means connected between said input connection and the input of said third amplifier means in shunt across said first and second resistance means.

6. Communication transmitting apparatus in accordance with claim 5 wherein said third amplifier means includes
transistor means connected in series between a source of operating potential and said first amplifier means; and
an operational amplifier means having an input connected to said D.C. limiting means and its output connected to said transistor means; said operational amplifier means being operable to vary current flow through the transistor means in accordance with the voltage applied at its input.

* * * * *